(12) United States Patent
Itonaga

(10) Patent No.: US 9,093,999 B2
(45) Date of Patent: Jul. 28, 2015

(54) OUTPUT CIRCUIT

(71) Applicant: FUJITSU SEMICONDUCTOR LIMITED, Yokohama, Kanagawa (JP)

(72) Inventor: Yuichi Itonaga, Obu (JP)

(73) Assignee: SOCIONEXT INC., Yokohoma (JP)

( * ) Notice: Subject to any disclaimer, the term of this patent is extended or adjusted under 35 U.S.C. 154(b) by 0 days.

(21) Appl. No.: 14/173,114

(22) Filed: Feb. 5, 2014

(65) Prior Publication Data
US 2014/0292379 A1    Oct. 2, 2014

(30) Foreign Application Priority Data

Mar. 29, 2013  (JP) ................. 2013-072878
Jan. 21, 2014  (JP) ................. 2014-008662

(51) Int. Cl.
*H03K 19/00*    (2006.01)
*H03K 19/003*    (2006.01)

(52) U.S. Cl.
CPC .......... *H03K 19/00* (2013.01); *H03K 19/00361* (2013.01)

(58) Field of Classification Search
CPC .............. H03K 19/00; H03K 19/00361
USPC ........ 327/109, 108, 111, 112, 309, 310, 311, 327/317, 318, 319, 333, 407, 409, 410, 412, 327/436
See application file for complete search history.

(56) References Cited

U.S. PATENT DOCUMENTS

2001/0054886 A1    12/2001    Takahashi et al.
2013/0141140 A1*    6/2013    Kumar .................. 327/108

FOREIGN PATENT DOCUMENTS

JP    2002-009608 A    1/2002
JP    2005-039560 A    2/2005
JP    2012-100163 A    5/2012

* cited by examiner

*Primary Examiner* — Jung Kim
(74) *Attorney, Agent, or Firm* — Arent Fox LLP

(57) ABSTRACT

An output circuit includes: a first PMOS transistor and a second PMOS transistor connected in series between a high potential side power source and an output node; a first NMOS transistor and a second NMOS transistor connected in series between a low potential side power source and the output node; a first capacitive coupling part connected between a gate of the first PMOS transistor and gates of the second PMOS transistor and the second NMOS transistor; and a second capacitive coupling part connected between a gate of the first NMOS transistor and gates of the second NMOS transistor and the second PMOS transistor, a first bias voltage is applied to the gate terminal of the second PMOS transistor, and a second bias voltage is applied to the gate terminal of the second NMOS transistor.

3 Claims, 12 Drawing Sheets

Vi : AC FLUCTUATIONS TRANSFERRED FROM Nout TO N7
VO : AC FLUCTUATIONS AT N7
a : AMPLITUDE OF AC FLUCTUATIONS TRANSFERRED FROM N1, N2 TO N7
    (IN RATIO TO Vi)
b : AMPLITUDE OF AC FLUCTUATIONS TRANSFERRED FROM N3, N4 TO N7
    (IN RATIO TO Vi)
$C_{GD}$ : PARASITIC CAPACITANCE BETWEEN Nout AND N7
$C_{GS}$ : PARASITIC CAPACITANCE BETWEEN N1 AND N7 AND BETWEEN N2 AND N7

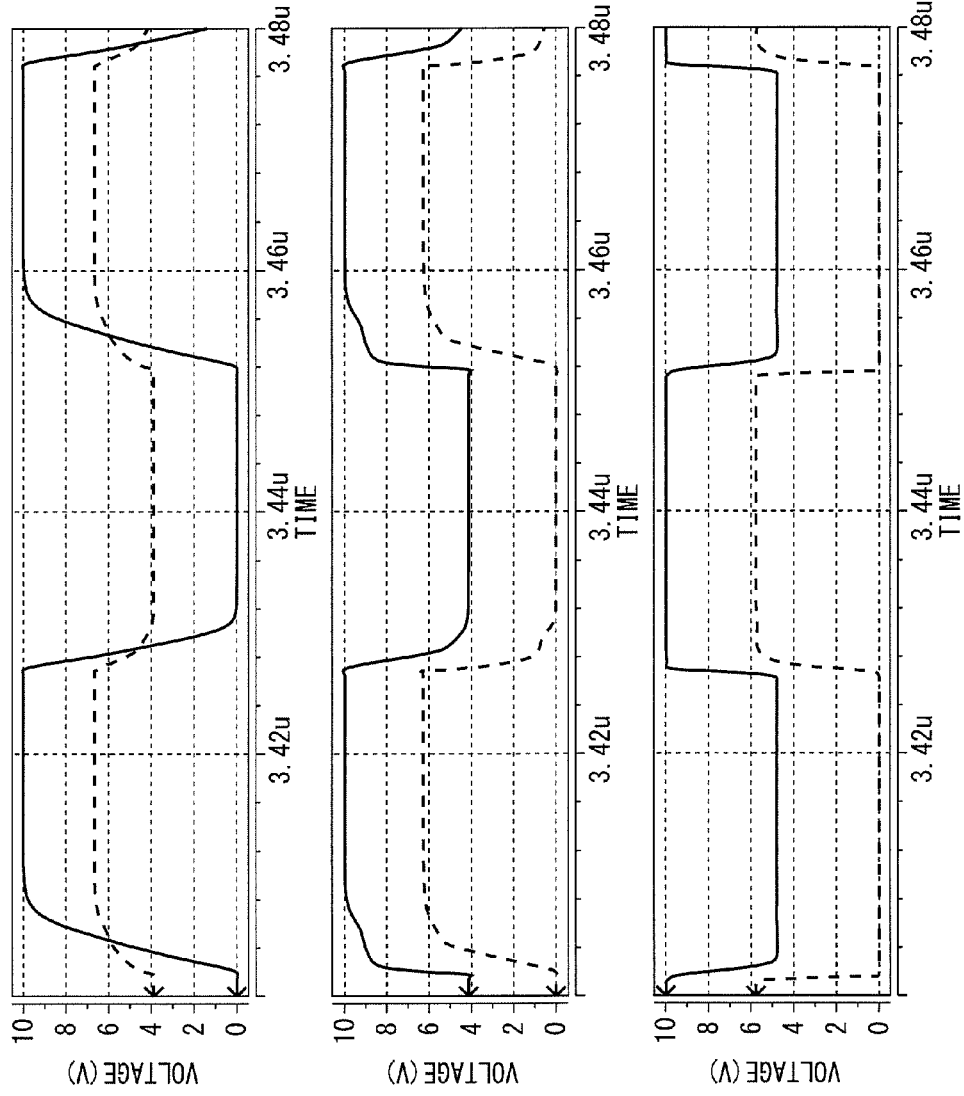

OUTPUT CIRCUIT

CROSS-REFERENCE TO RELATED APPLICATION

This application is based upon and claims the benefit of priority of the prior Japanese Patent Application No. 2013-072878, filed on Mar. 29, 2013, and No. 2014-008662, filed on Jan. 21, 2014, the entire contents of which are incorporated herein by reference.

FIELD

The technique disclosed herein relates to a high voltage output circuit formed by low withstand voltage transistors.

BACKGROUND

In recent years, in semiconductor devices, as the speed of an interface (I/F) part is increased and the voltage thereof is reduced, the transistor manufactured in the higher technology process tends to reduce the voltage that the transistor can handle. However, the majority of interfaces manufactured based on the standards not belonging to the high technology require high voltages. Because of this, when a high voltage output is produced in the output circuit formed by low withstand voltage transistors manufactured in the high technology process, a state where the withstand voltage is not sufficient is brought about.

Consequently, a high voltage output circuit is formed using low withstand voltage transistors by cascode-connecting the low withstand voltage transistors to disperse the voltage applied to the transistors. In such an output circuit, a drive signal the level of which is shifted is applied to the gates of part of the transistors and at the same time, a bias voltage is applied to the gates of the other transistors.

In the output circuit, the drive signal and noise from the output node affect the bias voltage and fluctuate the bias voltage. If the bias voltage fluctuates, there is a possibility that the voltage applied to the transistor exceeds the withstand voltage, and therefore, the transistor is destroyed.

In the case where a high frequency operation is performed in such an output circuit, the device size of PMOS transistors and NMOS transistors that appears from the output terminal is increased. Because of this, the capacitance between gate and drain of the transistor increases accompanying this and AC fluctuations at the output terminal largely affect the node of the bias voltage via the capacitance. Because of this, the bias voltage fluctuates and if the fluctuations are large, it is no longer possible to guarantee the withstand voltage.

Consequently, a bypass capacitor is connected between the signal line of the bias voltage and a reference voltage source (GND) and thereby the fluctuations in the bias voltage due to noise are suppressed. However, in general, the capacitor used within LSI increases the size of the LSI, and therefore, if a large-sized capacity is provided, the size of LSI is increased and if the size of the capacitor is reduced, the capacitance is reduced and it is not possible to sufficiently reduce noise.

Further, it is proposed to connect a capacitor between the signal line of the bias voltage and the signal line of the drive signal so as to suppress fluctuations in the bias voltage. However, in order to suppress the bias voltage, the capacitance value etc. is appropriately set.

RELATED DOCUMENTS

[Patent Document 1] Japanese Laid Open Patent Document No. 2002-009608

[Patent Document 2] Japanese Laid Open Patent Document No. 2005-039560

[Patent Document 3] Japanese Laid Open Patent Document No. 2012-100163

SUMMARY

An output circuit according to a first aspect of the embodiments, includes: a first PMOS transistor and a second PMOS transistor connected in series between a high potential side power source and an output node, the first PMOS transistor being connected to the high potential side power source side and the second PMOS transistor being connected to the output node side; a first NMOS transistor and a second NMOS transistor connected in series between a low potential side power source and the output node, the first NMOS transistor being connected to the low potential side power source side and the second NMOS transistor being connected to the output node side; a first capacitive coupling part including a first terminal and a second terminal, the first terminal being connected to a gate terminal of the first PMOS transistor, the second terminal being connected to a gate terminal of the second PMOS transistor or a gate terminal of the second NMOS transistor, and the first capacitive coupling part being configured to control capacitive coupling between the first and second terminals based on a potential at the gate terminal of the first PMOS transistor; and a second capacitive coupling part including a third terminal and a fourth terminal, the third terminal being connected to a gate terminal of the first NMOS transistor, the fourth terminal being connected to the gate terminal of the second NMOS transistor or the gate terminal of the second PMOS transistor, and the second capacitive coupling part being configured to control capacitive coupling between the third and fourth terminals based on a potential at the gate terminal of the first NMOS transistor, wherein a first bias voltage is applied to the gate terminal of the second PMOS transistor, a second bias voltage is applied to the gate terminal of the second NMOS transistor, a first drive signal is supplied to the gate terminal of the first PMOS transistor, and a second drive signal is supplied to the gate terminal of the first NMOS transistor.

An output circuit according to a second aspect of the embodiments, includes: a first PMOS transistor and a second PMOS transistor connected in series between a high potential side power source and an output node, the first PMOS transistor being connected to the high potential side power source side and the second PMOS transistor being connected to the output node side; a first NMOS transistor and a second NMOS transistor connected in series between a low potential side power source and the output node, the first NMOS transistor being connected to the low potential side power source side and the second NMOS transistor being connected to the output node side; a step-down part to which a voltage signal at the output node is input and which is configured to limit a maximum value of an amplitude of the voltage signal to a first bias voltage greater than a voltage of the low potential power source and smaller than the high potential side power source; an inversion part configured to invert an output of the step-down part; and a capacitor connected between a gate terminal of the second PMOS transistor and an output terminal of the inversion part, wherein the first bias voltage is applied to gates of the second PMOS transistor and the second NMOS transistor, a first drive signal is supplied to a gate of the first PMOS transistor, and a second drive signal is supplied to a gate of the first NMOS transistor.

An output circuit according to a third aspect of the embodiments includes: a first PMOS transistor and a second PMOS transistor connected in series between a high potential side power source and an output node, the first PMOS transistor being connected to the high potential side power source side and the second PMOS transistor being connected to the output node side; a first NMOS transistor and a second NMOS transistor connected in series between a low potential side power source and the output node, the first NMOS transistor being connected to the low potential side power source side and the second NMOS transistor being connected to the output node side; a first step-down part to which a voltage signal at the output node is input and which is configured to limit a maximum value of an amplitude of the voltage signal to a first bias voltage greater than a voltage of the low potential power source and smaller than the high potential side power source; a second step-down part to which a voltage signal at the output node is input and which is configured to limit a maximum value of an amplitude of the voltage signal to a second bias voltage greater than the first bias voltage and smaller than the high potential side power source; a first inversion part configured to invert a signal of the first step-down part; a second inversion part configured to invert a signal of the second step-down part; a first capacitor connected between a gate terminal of the second PMOS transistor and an output terminal of the second inversion part; and a second capacitor connected between a gate terminal of the second NMOS transistor and an output terminal of the first inversion part, wherein the first bias voltage is applied to the gate terminal of the second PMOS transistor, the second bias voltage is applied to the gate terminal of the second NMOS transistor, a first drive signal is supplied to a gate terminal of the first PMOS transistor, and a second drive signal is supplied to a gate terminal of the first NMOS transistor.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIGS. 4A to 4C illustrate results when voltage fluctuations at each node are simulated in the output circuit in FIG. 2;

DESCRIPTION OF EMBODIMENTS

Before explaining an output circuit of the embodiment, a general output circuit formed by low withstand voltage transistors and which outputs a high voltage signal will be explained.

Figure 1:
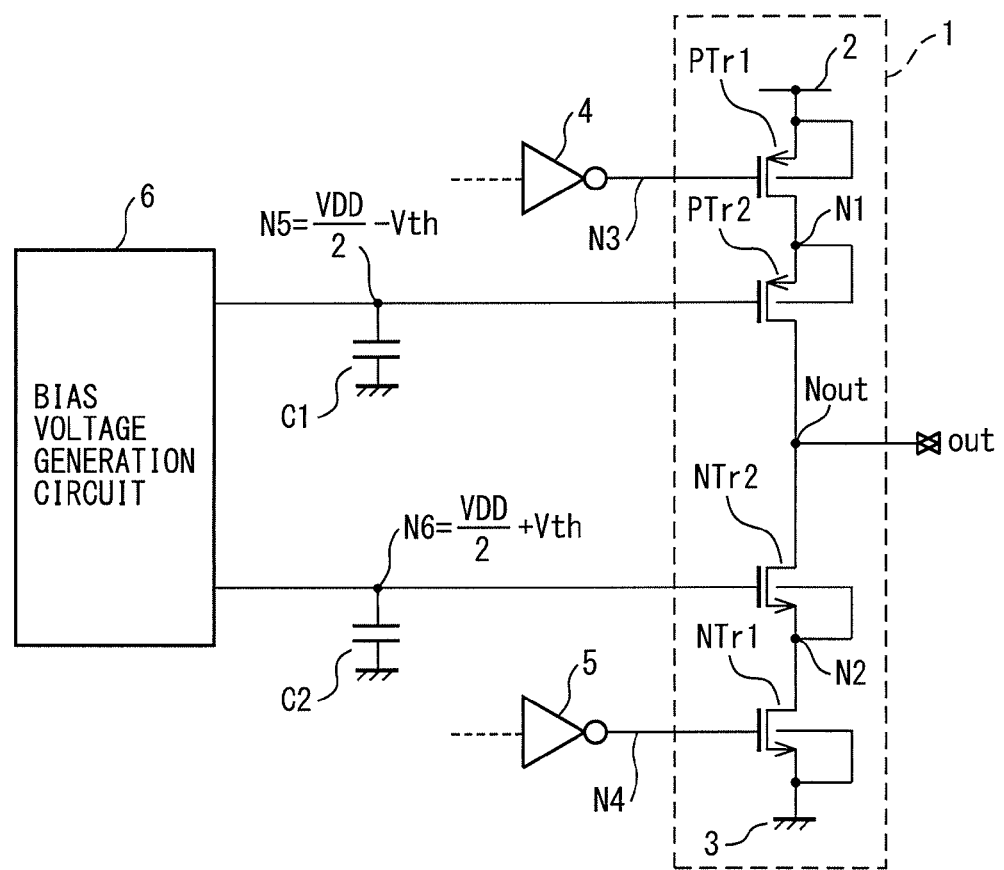
FIG. 1 is a diagram illustrating a configuration of a general output circuit.

FIG. 1 is a diagram illustrating a configuration of a general output circuit.

The explanation is carried out under the assumption that in the circuit in FIG. 1, the limit of the withstand voltage of each transistor is half a power source voltage VDD (for example, 10 V), i.e. VDD/2+a (for example, 5.5 V) and if a voltage corresponding to VDD is applied between drain and source, the transistor is destroyed. A case is considered where the output circuit is configured by a general inverter in which a PMOS transistor (hereinafter, PTr) and an NMOS transistor (hereinafter, NTr) are connected in series between VDD and GND (0 V). In this case, at the time of L level (GND) output, a voltage corresponding to VDD is applied to PTr and at the time of H level (VDD) output, it is applied to NTr, and each device is destroyed as a result.

Because of this, the output circuit is formed as illustrated in FIG. 1. The output circuit has an output part 1. The output part 1 has two PTr1 and PTr2 and two NTr1 and NTr2 connected in series between a high potential side power source terminal 2 and a low potential side power source terminal 3. The voltage at the high potential side power source terminal 2 is taken to be VDD and the voltage at the low potential side power source terminal 3 is taken to be 0 V (GND). The substrate of the channel of each transistor is connected to the source. A connection node Nout of PTr2 and NTr2 is connected to an output terminal out.

The gate of PTr1 is connected to an output node N3 of a buffer (inverter) 4 and the gate of NTr1 is connected to an output node N4 of a buffer 5. The buffer 4 performs control so that the voltage of a signal output to the output node N3 changes between VDD/2 and VDD and the buffer 5 performs control so that the voltage of a signal output to the output node N4 changes between GND and VDD/2. In other words, the signals at N3 and N4 are output signals generated in a circuit that uses VDD/2 and GND as a power source voltage and the level of which is converted into one between GND and VDD.

The gate of PTr2 and the gate of NTr2 are connected to output nodes N5 and N6 of a bias voltage generation circuit 6. The voltage at N5 is Vbiasp=VDD/2−Vth and the voltage at N6 is Vbiasn=VDD/2+Vth. For example, if it is assumed that Vth=0.3 V and VDD/2=5.0 V, then Vbiasp=4.7 V and Vbiasn=5.3 V hold and PTr2 and NTr2 are in the on state at all times. Due to this, PTr2 fixes the potential at a node N1 to VDD/2, which is raised from Vbiasp by an amount corresponding to Vth. NTr2 fixes the potential at a node N2 to VDD/2, which is reduced from Vbiasn by an amount corresponding to Vth.

At the time of output of Nout=0 V, a voltage of VDD−VDD/2=VDD/2 is applied between the source and the drain of PTr1 and a voltage of VDD/2−0 V=VDD/2 is applied between the source and the drain of PTr2, both being equal to or less than the withstand voltage. The voltage between the source and the drain of NTr1 and NTr2 is 0 V. At the time of output of Nout=VDD, a voltage of VDD/2−0 V=VDD/2 is applied between the source and the drain of NTr 1 and a voltage of VDD−VDD/2=VDD/2 is applied between the source and the drain of NTr2, both being equal to or less than the withstand voltage. The voltage between the source and the drain of PTr1 and PTr2 is 0 V.

As above, even if a signal that changes between 0 and VDD is output to Nout, it is possible to prevent the withstand voltage of PTr1 and PTr2, and NTr1 and NTr2 of the output part 1 from becoming insufficient.

With regard to the settings of the bias voltage output by the bias voltage generation circuit 6, it is sufficient to appropriately do settings in accordance with the withstand voltage of the transistor and it may also be possible to reduce the size by putting together the bias nodes into one line.

Figure 2:
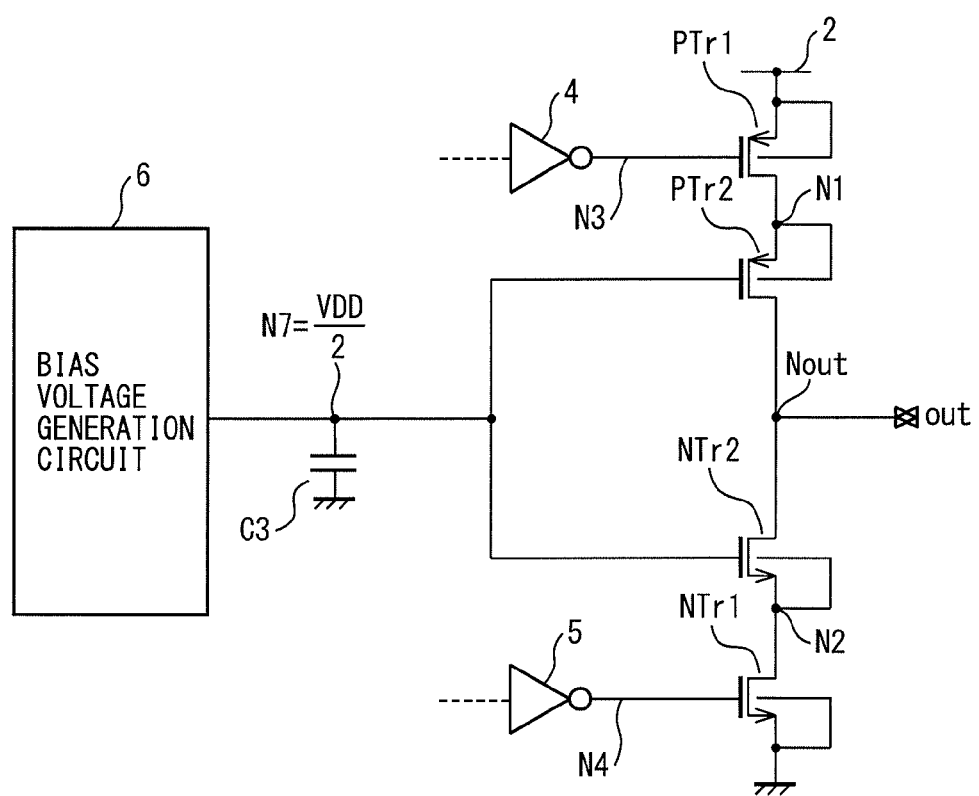
FIG. 2 is an example in which the number of kinds of bias voltage that the bias voltage generation circuit outputs to a node is set to one and the bias voltage applied to the gates of transistors is set to VDD/2.

FIG. 2 is an example in which the number of kinds of bias voltage that the bias voltage generation circuit 6 outputs to a node N7 is set to one and the bias voltage applied to the gates of PTr2 and NTr2 is set to VDD/2. In the circuit in FIG. 2, for example, the potential at the node N1 at the time of output of out=0 V becomes the bias voltage+Vth=VDD/2+Vth (for example, 5.3 V), and therefore, if the withstand voltage of the transistor is equal to or more than the potential difference, for example, 5.5 V, there arises no problem. This also applies to NTr1 and NTr2.

In the examples in FIG. 1 and FIG. 2, the examples are illustrated in which two PTrs and two NTrs are connected in series, however, it may also be possible to connect three or more PTrs and three or more NTrs in accordance with the output voltage and the withstand voltage of the transistors.

First, explanation is continued with the circuit in FIG. 2 as an example.

In the case where a high frequency operation is performed in the output circuit in FIG. 2, it is desirable to set large the device size of PTr2 and NTr2 that appears from the output terminal out. Because of this, the capacitance between gate and drain of the transistor becomes large accompanying this and via the capacitance, AC fluctuations at the node Nout propagate to the node N7 at the bias voltage in a magnitude that is not ignored. Due to this, the voltage at N7 fluctuates and if the fluctuations are large, the potentials at the nodes N1 and N2 also fluctuate and it is no longer possible to guarantee that the voltage applied to the transistors is equal to or less than the withstand voltage.

Consequently, in the circuit in FIG. 1, a bypass capacitor C1 is connected between the bias voltage output node N5 of the bias voltage generation circuit 6 and GND, and a bypass capacitor C2 is connected between the bias voltage output node N6 and GND. Further, in the circuit in FIG. 2, a bypass capacitor C3 is connected between the bias voltage output node N7 of the bias voltage generation circuit 6 and GND. By providing the bypass capacitor C3, the amplitude of noise produced at the node N7 is reduced.

The larger the capacitance value, the more the bypass capacitor C3 reduces the amplitude of noise, however, generally, if the capacitance value of a capacitor provided within LSI is increased, its size is also increased, and therefore, the size impact becomes a problem.

The AC fluctuations at the output node Nout are associated with the drive signal at the nodes N3 and N4, and it can be thought to reduce noise produced at N7 by providing capacitors between the bias voltage output node 7 and the node N3 and between that and the node N4, respectively.

Figure 3A:
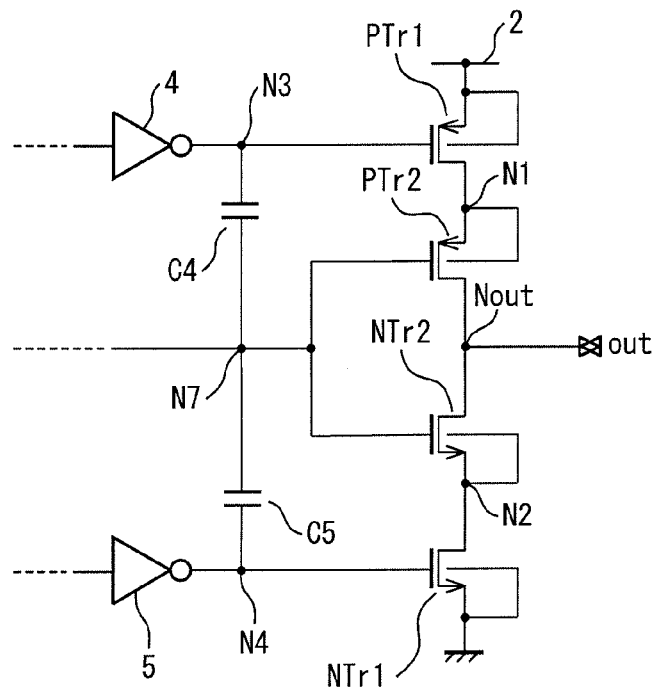
FIG. 3A is a diagram illustrating a configuration example of an output circuit of a first embodiment.
Figure 3B:
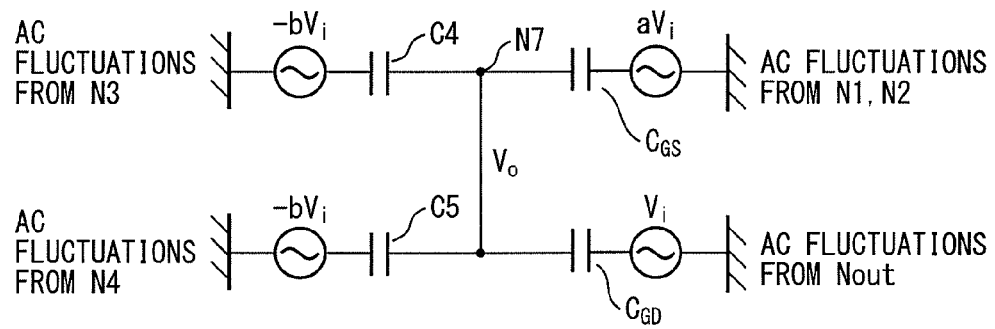
FIG. 3B illustrates an equivalent circuit of the output circuit in FIG. 3A.

FIG. 3A is a diagram illustrating a configuration example of an output circuit of a first embodiment. FIG. 3B illustrates an equivalent circuit of the output circuit in FIG. 3A.

As illustrated in FIG. 3A, the output circuit of the first embodiment has a configuration in which the node N3 and the bias voltage output node N7, and the node N4 and the bias voltage output node N7 are capacitively coupled (decoupling) by capacitors C4 and C5, respectively, in the output circuit in FIG. 2.

The output signal output from the output node Nout is a signal of opposite phase to that of the drive signals at the node N3 and N4. Because of this, the change in voltage caused at the node N7 in accordance with the change in the drive signals at the node N3 and N4 is of opposite phase to that of the change in voltage caused at N7 via the capacitance between gate and drain of PTr2 and NTr2 from Nout due to the capacitors C4 and C5, and therefore, they cancel each other. Consequently, the capacitor C4 functions as a first opposite phase coupling cancellation part and the capacitor C5 functions as a second opposite phase coupling cancellation part.

The output circuit in FIG. 3A cancels voltage fluctuations (noise) caused at the node N7 due to voltage fluctuations at the output node Nout and the capacitance value may be small compared to those of the bypass capacitors C1 to C3 illustrated in FIG. 1 and FIG. 2. However, the output circuit cancels voltage fluctuations and if the conditions of cancellation are not met sufficiently, there may be a case where voltage fluctuations caused at the node N7 is not suppressed sufficiently and voltage fluctuations become large on the contrary.

Desirably, the signal that is capacitively coupled in order to cancel noise from the output node Nout is a signal whose phase is not shifted so much from a signal whose phase is of opposite phase, i.e., 180 shifted from that of the positive phase signal, which is the signal at the output node Nout. Because of this, in the circuit in FIG. 3A, the node N7 is capacitively coupled with the nodes N3 and N4 at which the drive signals are output by the capacitors C4 and C5, respectively. As described above, in the circuit in FIG. 3A, what is done is only to capacitively couple the already-existing circuits, and therefore, a circuit is not newly added to prepare an opposite phase signal.

Next, the operation of the output circuit in FIG. 3A will be explained.

In the circuit in FIG. 3A, at the time of output operation, the potential at the output node Nout connected to the output terminal out changes between 0 V and VDD. This AC fluctuation component is transferred to the bias voltage output node N7 via the capacitance between gate and drain of PTr2 and NTr2 that appears from the output terminal. The drive signals that the buffer 4 and the buffer 5 output to the output nodes N3 and N4 substantially at the same instant are "opposite phase signals". N3 and N4 are capacitively coupled to the node N7 via the capacitors C4 and C5, and therefore, the cancellation operation is caused between the AC fluctuations at the output node Nout and the "opposite phase signals", and thus, the voltage fluctuations at N7 are suppressed. The capacitors C4 and C5 may have a capacitance value about the same as the capacitance between gate and drain of PTr2 and NTr2, and even with a capacitance value smaller than that in the case where the bypass capacitor is used, the voltage fluctuations at the bias voltage output node N7 are suppressed effectively.

It is important that by utilizing the buffer in the previous stage of output, the shift in phase between the original positive phase signal and the "opposite phase signal" is set to substantially 180 degrees. The voltage fluctuations at N7 in FIG. 3A are suppressed by "cancellation" and in the case where the shift in phase of the signal to be coupled is large, there is a possibility that the cancellation effect by the opposite phase signal appears before or after voltage fluctuations caused by fluctuations at the output terminal may occur. In such a case, the voltage fluctuations at N7 is not suppressed and there is a possibility that it is no longer possible to guarantee the withstand voltage of the transistor.

A method for calculating conditions to cancel the voltage fluctuations at the bias voltage output node caused by the opposite phase signal is explained.

FIG. 3B illustrates a small signal equivalent circuit in relation to the voltage fluctuations at the node N7 in the output circuit in FIG. 3A.

In FIG. 3B, Vi denotes AC fluctuations transferred from the output node Nout to N7, Vo denotes AC fluctuations at N7, a denotes the amplitude of AC fluctuations transferred from N1 and N2 to N7 expressed in a ratio with respect to Vi, b denotes the amplitude of AC fluctuations transferred from N3 and N4 to N7 expressed in a ratio with respect to Vi, $C_{GD}$ denotes a parasitic capacitance between Nout and N7, and $C_{GS}$ denotes a parasitic capacitance between N1 and N7, and between N2 and N7.

From the equivalent circuit in FIG. 3B, as a transfer function expressing the voltage fluctuations (AC fluctuations) transferred from the output node Nout to the bias voltage node N7, an expression below is obtained. If it is assumed that $C_{GD}$ and $C_{GS}$ are equal and C4 and C5 are equal, the expression is approximated as one on the right side of the expression.

$$Vo/Vi=(aC_{GS}+C_{GD}-bC4-bC5)/(C_{GS}+C_{GD}+C4+C5)\approx ((a+1)C_{GD}-2bC5)/(2C_{GD}+2C5)$$

For example, in the case where it is desired to cancel the voltage fluctuations at N7, it is sufficient to put the numerator of the above-described expression to 0, and therefore, the capacitance value of C4 and C5 will be a value $(a+1)/(2b)$ times $C_{GD}$ as a result. In the case where only small cancellation is made, it may be possible to reduce the capacitance value in accordance with the degree to which voltage fluctuations are desired to be suppressed and the capacitance value is set appropriately to a value equal to or less than $(a+1)/(2b)$ times $C_{GD}$.

For comparison with the output circuit in FIG. 2, to which degree voltage fluctuations are suppressed in the case where a capacitor having a capacitance value substantially the same as that of the output circuit in FIG. 3A is connected as the bypass capacitor C3 in FIG. 2 is discussed.

It is assumed that a≈b≈0.5 in FIG. 3B and settings are done so as to perfectly cancel voltage fluctuations in the output circuit in FIG. 3A, i.e. the capacitance of C4 and C5 is set to $(a+1)/(2b)=1.5$ times $C_{GD}$. Further, for comparison of effects between the circuit in FIG. 2A and the circuit in FIG. 3A, the capacitance value obtained by combining the capacitance values of C4 and C5 in FIG. 3A is set to be same as the capacitance value of C3 in FIG. 2.

In this case it is possible to express the voltage fluctuations at the node N7 of the output circuit in FIG. 2 by an expression below.

$$V0/Vi=(aC_{GS}+C_{GD})/(C_{GS}+C_{GD}+C3)\approx((a+1)C_{GD})/(2C_{GD}+C3)$$

According to the previous descriptions, it is assumed that $C3=C4+C5=2\times C4$, $a=0.5$, and therefore, an expression below is derived.

$$V0/Vi=1.5C_{GD}/(2C_{GD}+2C4)=1.5C_{GD}/(2C_{GD}+3C_{GD})=0.3$$

From the above, it is concluded that fluctuations of about 0.3 times the AC fluctuations at the output node Nout are transferred to the bias output node N7.

As described above, even in the case where the capacitor of the same capacitance value is used, it is only possible to suppress the voltage fluctuations at N7 to about 0.3 times the original ones in the output circuit in FIG. 2. In contrast to this, in the output circuit in FIG. 3A, the voltage fluctuations at N7 are cancelled and suppressed to substantially zero.

FIG. 4A to FIG. 4C illustrate results when voltage fluctuations at each node are simulated in the output circuit in FIG. 2.

Circuit constants with which simulation was performed are as follows.

VDD=10 V, temperature=25° C., transistor withstand voltage=5.5 V. W and L of PTr1 and PTr2 of the output part 1=200 μm and 0.7 μm, and W and L of NTr1 and NTr2=100 μm and 0.7 μm. $C_{GD}$ and $C_{GS}$ are equal to about 0.157 pF. C3=0.5 pF. In the circuit in FIG. 3A, C4=C5=0.25 pF.

In FIG. 4A, the solid line represents the voltage fluctuations at the output node Nout and the broken line represents the voltage fluctuations at the node N7. In FIG. 4B, the solid line represents the voltage fluctuations at the node N1 and the broken line represents the voltage fluctuations at the node N2. In FIG. 4C, the solid line represents the voltage fluctuations at the node N3 and the broken line represents the voltage fluctuations at the nod N4.

As described previously, 3 V, which is about 0.3 times the voltage fluctuations at the output node Nout, is transferred to N7, and in FIG. 4A, this is true and agrees with the simulation result.

Because of this, the voltage between drain and source of PTr2 and NTr2 becomes about 6.5 V at the maximum and this means that a potential difference equal to or greater than the withstand voltage of the transistor is applied, and therefore, it is not possible to guarantee the withstand voltage in this state. Consequently, the capacitance of the bypass capacitor C3 is further increased as a result.

Figure 5:
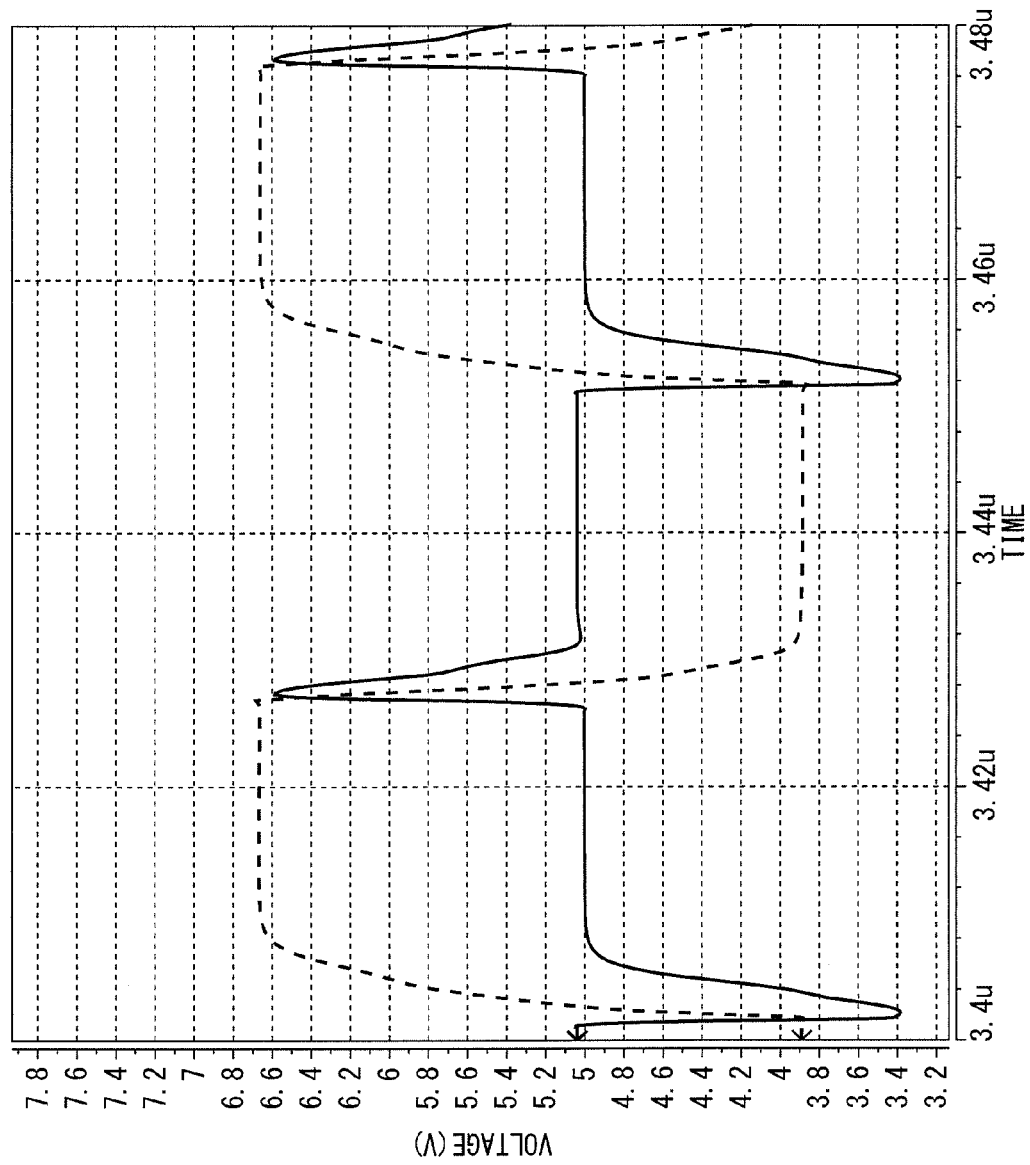
FIG. 5 illustrates both of simulation results of the voltage fluctuation of the output circuits in FIG. 2 and a first embodiment when capacitors of a same value are arranged for suppressing voltage fluctuations of the bias voltage output nodes in order to clearly illustrate a spike suppression effect.

FIG. 5 comparatively illustrates results when the voltage fluctuation at the bias voltage output node in the output circuit in FIG. 2 is simulated and when the voltage fluctuation at the bias voltage output node in the output circuit in FIG. 3A is simulated.

The conditions of the simulation are the same as those of the simulation in FIG. 4A to FIG. 4C except in that C4=C5=0.25 pF is set. In FIG. 5, the solid line represents the voltage fluctuation at the output node N7 in FIG. 3 and the broken line represents the voltage fluctuation at the node N7 in FIG. 2.

As described previously, by the capacitive coupling on the assumption of C4=C5=0.25 pF, the influence of the voltage fluctuations from Nout is cancelled and the potential at the node N7 is kept substantially in the vicinity of the target value of the original bias voltage=VDD/2 (5 V).

As above, it is known that the output circuit of the first embodiment can satisfy the withstand voltage in terms of the direct current characteristics, however, in the case where attention is focused on the instant of switching, in the waveform at the bias voltage output node N7, a potential difference that exceeds the withstand voltage of the transistor is reached for an instant by a spike. The spike mainly results from the steepness of the output waveform at the buffer in the previous stage of the output part and from the viewpoint of withstand voltage, it is desirable to also suppress the voltage fluctuations due to the spike.

Figure 6:
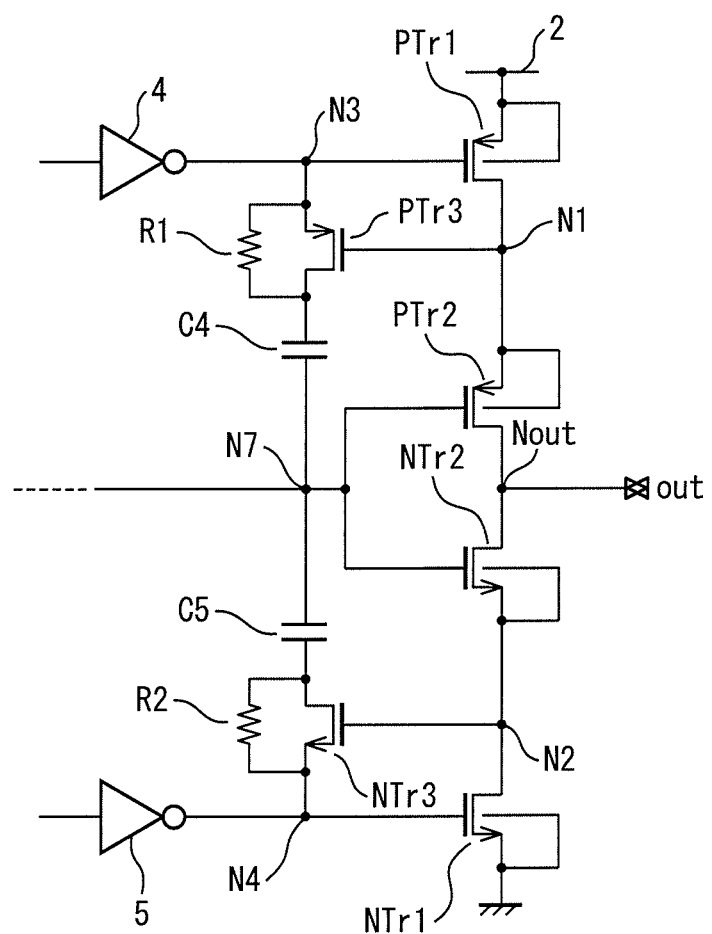
FIG. 6 is a diagram illustrating a configuration of an output circuit of a second embodiment.

FIG. 6 is a diagram illustrating a configuration of an output circuit of a second embodiment.

The output circuit of the second embodiment differs from the output circuit of the first embodiment in FIG. 3A in that a resistor R1 and a PMOS transistor PTr3 are connected in parallel between the capacitor C4 and the node N3 and a resistor R2 and an NMOS transistor NTr3 are connected in parallel between the capacitor C5 and the node N4. In other words, in the second embodiment, the first opposite phase coupling cancellation part has the resistor R1 and the PMOS transistor PTr3 connected in parallel and the capacitor C4 connected in series thereto. Further, the second opposite phase cancellation part has the resistor R2 and the NMOS transistor NTr3 connected in parallel and the capacitor C5 connected in series thereto.

Hereinafter, the operation of the output circuit of the second embodiment is explained.

In general, for the output signals of the buffers 4 and 5 in the previous stage of the output part, the gate control timing by a drive signal is shifted intentionally so as to prevent PTr1 and NTr1 from turning on at the same time in order to suppress the penetrating current at the output part. In the case of a signal whose potential at the output node Nout rises to H, after the potential at N4 is turned to L and NTr1 is turned off (brought out of conduction), N5 is turned to L and PTr1 is turned on (brought into conduction). Because of this, the waveform changes with time in the order of a steep rise in the potential at N4, a gradual fall in the potential at N3, and a gradual rise at the output node Nout. Because of this, there is a slight shift in phase between voltage signals at each node, i.e. the phase shift between N4 and Nout is 180 degrees+α and the phase shift between N3 and Nout is about 180 degrees.

As described previously, in the case where cancellation of the bias node fluctuations due to the opposite phase signal is considered, desirably, the "opposite phase signal" to be used is a signal whose phase is not shifted so much from the phase of 180 degrees with respect to the original positive phase signal. Because of this, the latter phase shift between N3 and Nout does not bring any problem even if the signal at N3 is capacitively coupled as it is, however, the former phase shift between N4 and Nout is not in the ideal state. That is, between N4 and Nout, N4 fluctuates an instant earlier. Because of this, if it is used as the "opposite phase signal" without taking any measures, as illustrated in FIG. 5, the cancellation operation is performed an instant earlier at the instant of switching, resulting in a factor that causes a spike at the bias voltage output node N7.

Consequently, in the output circuit of the second embodiment, the first opposite phase coupling cancellation part connected between the node N3 and the bias voltage output node N7 is formed by the resistor R1 and the PMOS transistor PTr3 connected in parallel and the capacitor C4 connected in series thereto. The gate of PTr3 is connected to the node N1. Further, the second opposite phase coupling cancellation part connected between the node N4 and the bias voltage output node N7 is formed by the resistor R2 and the NMOS transistor NTr3 connected in parallel and the capacitor C5 connected in series thereto. The gate of NTr3 is connected to the node N2.

In the second embodiment, by utilizing the signal of the output circuit itself, which is returned to the input thereof (feedback signal), as the control signal of the gates of PTr3 and NTr3, the impedance of the first and second opposite phase coupling cancellation parts is adjusted. Due to this, control to appropriately adjust the timing at which the drive signals at the nodes N3 and N4 are transferred to the node N7 is performed.

A case is explained, where the output node Nout rises from L to H.

First, in the case where attention is focused on the transfer of AC fluctuations from N3 to N7, the phase shift between N3 and Nout is about 180 degrees as described previously, and therefore, the timing adjustment in capacitive coupling by C4 is not carried out, and it is desirable to bring about a state where the resistance component between N3 and C4 is substantially zero. In the second embodiment, this state is realized by turning on PTr3. That is, the transition of the potential at N1 at the instant of output is such that VDD/2+Vth changes to VDD and in an interlocking manner, PTr3 transitions from on to off, and therefore, the resistance component between N3 and C4 is substantially zero at the instant of output.

Similarly, for the transfer of AC fluctuations from N4 to N7, the timing adjustment in capacitive coupling by C5 is carried out, and adjustment is made by the resistance component between N4 and C5. This adjustment is realized by the second resistor R2 and NTr3. That is, the transition of potential at N2 at the instant of output is from 0 V to VDD/2−Vth, and in an interlocking manner, NTr3 transitions from off to on, and therefore, at the instant of output, the resistance component between N4 and C5 is about R2, and due to this, the timing adjustment is made.

In the case where the output node Nout falls from H to L, the opposite operation is performed, and therefore, explanation is omitted.

By the above series of operations, the spike caused at the time of cancellation of voltage fluctuations is suppressed by adjusting the capacitive coupling timing to the bias voltage output node N7 even if the outputs of the buffers 4 and 5 in the previous stage, the phases of which are shifted, are used as opposite signals.

Figure 7A:
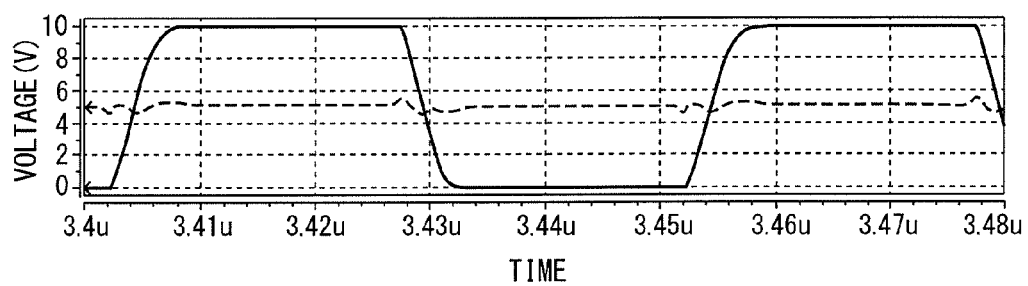
FIGS. 7A to 7C illustrate results when voltage fluctuations at each node are simulated in the output circuit of the second embodiment.
Figure 7B:
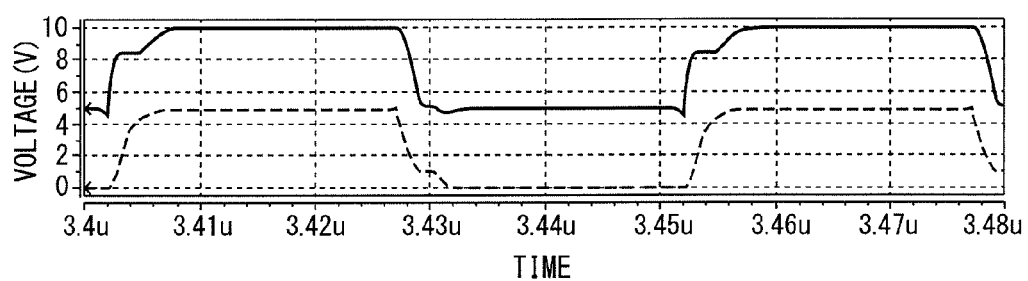
Figure 7C:
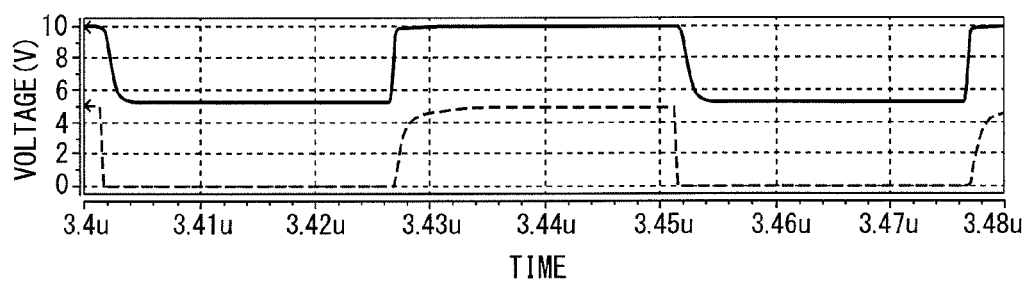

FIGS. 7A to 7C illustrate results when voltage fluctuations at each node are simulated in the output circuit of the second embodiment.

Circuit constants with which the simulation was performed are as follows.

VDD=10 V, temperature=25° C., and transistor withstand voltage=5.5 V. W and L of PTr1 and PTr2 of the output part 1=200 μm and 0.7 μm, and W and L of NTr1 and NTr2=100 μm and 0.7 μm. $C_{GD}$ and $C_{GS}$ are equal to about 0.16 pF. C4=C5=0.25 pF and the combined capacitance value is about 1.5 times $C_{GS}$.

In FIG. 7A, the solid line represents the voltage fluctuations at the output node Nout and the broken line represents the voltage fluctuations at the node N7. In FIG. 7B, the solid line represents the voltage fluctuations at the node N1 and the broken line represents the voltage fluctuations at the node N2. In FIG. 7C, the solid line represents the voltage fluctuations at the node N3 and the broken line represents the voltage fluctuations at the node N4.

In FIG. 7A to FIG. 7C, if attention is focused on the waveforms at the output nodes N3 and N4 of the buffers 4 and 5, as described previously, when the output Nout rises from L to H, N5 falls steeply and N 4 falls gradually. When the output Nout falls from H to L, N3 rises steeply and N4 rises gradually. One of the nodes whose rise and fall are steep fluctuates an instant earlier compared to the other capacitively coupled node, and therefore, if no measures are taken, as illustrated in FIG. 5, a spike is caused at the bias voltage output node N7. However, in the second embodiment, when Nout rises, control is performed so that N2 turns to 0 V and NTr3 turns off at the instant that N4 rises steeply, and therefore, the coupling of N4 with N7 is made gradual by the resistor R2. Further, when Nout falls, control is performed so that N1 turns to VDD and PTr3 turns off at the instant that N3 rises steeply, and therefore, the coupling of N3 with N7 is made gradual by the resistor R1. Because of this, a spike is suppressed from being caused due to steep fluctuations at N3 and N4.

Figure 8:
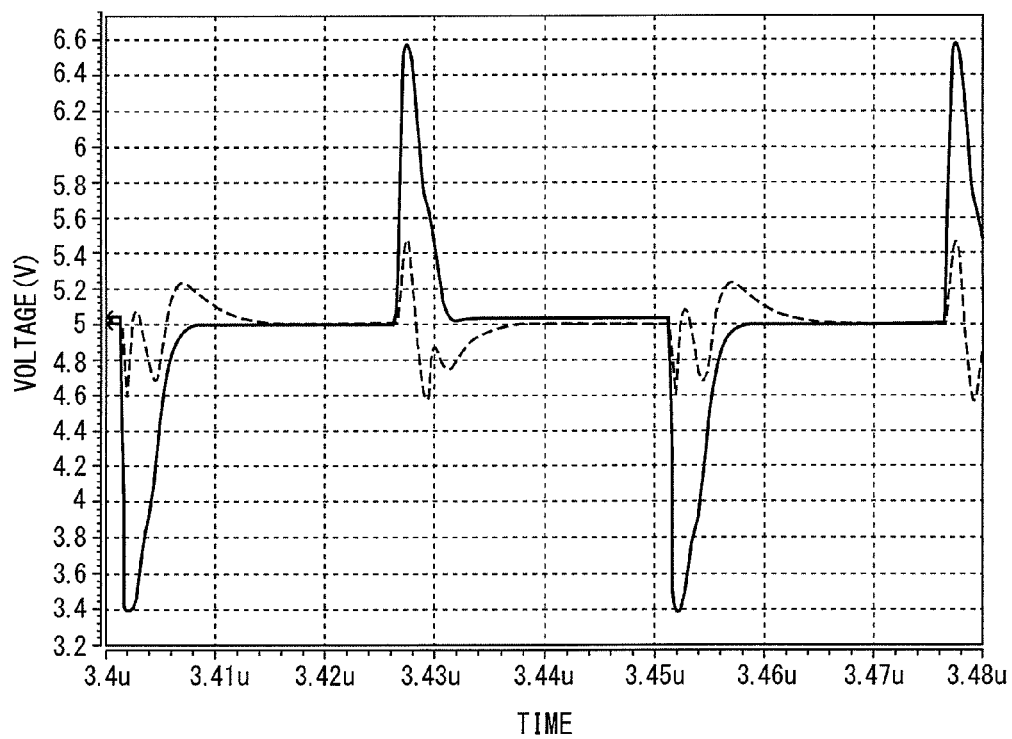
FIG. 8 is a diagram illustrating combined results of simulation of the voltage fluctuations at the bias voltage output node N7 of the first embodiment and the second embodiment in order to illustrate the spike suppression effect more clearly.

FIG. 8 is a diagram illustrating combined results of simulation of the voltage fluctuations at the bias voltage output node N7 of the first embodiment and the second embodiment in order to illustrate the spike suppression effect more clearly, and the solid line represents the case of the first embodiment and the broken line represents the case of the second embodiment. In other words, FIG. 8 is a diagram in which the simulation results of the second embodiment are overlapped on the solid line in FIG. 5.

From FIG. 8, it is confirmed that in the second embodiment, the spike at the time of switching is suppressed considerably compared to the first embodiment.

Figure 9:
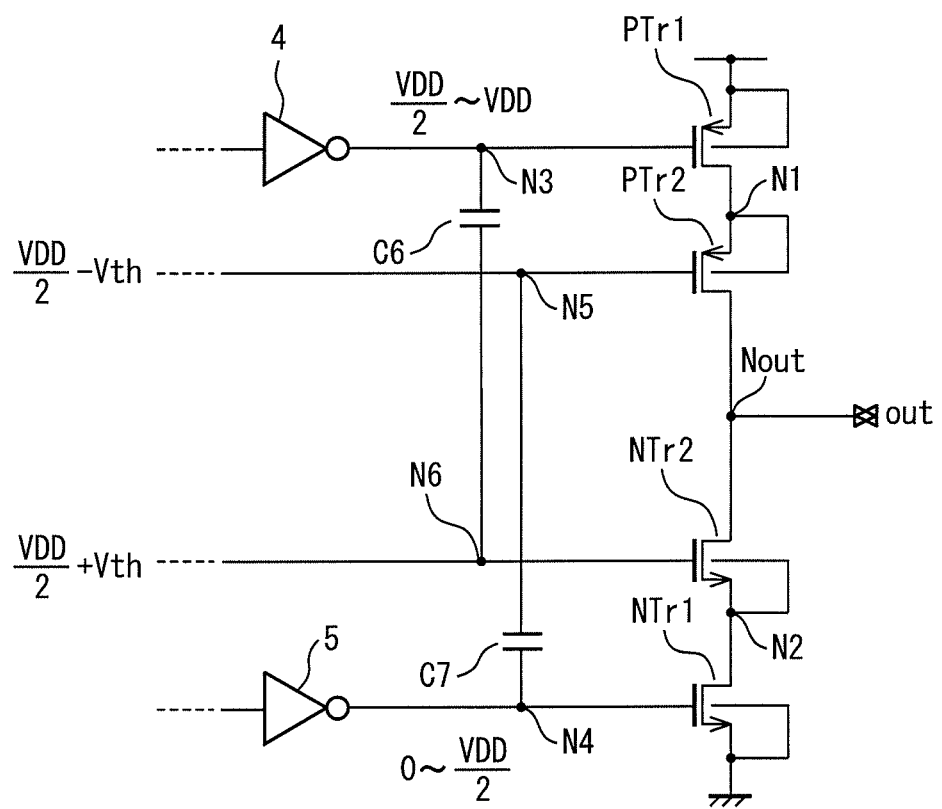
FIG. 9 is a diagram illustrating a configuration of an output circuit of a third embodiment.

FIG. 9 is a diagram illustrating a configuration of an output circuit of a third embodiment.

The output circuit of the third embodiment is an output circuit having the two bias voltage output nodes N5 and N6, in which a capacitor C6 is connected between N3 and N6 and a capacitor C7 between N4 and N5. In other words, the output circuit of the third embodiment is an example in which the configuration of the first embodiment is applied to the output circuit in FIG. 1 having two bias voltage output nodes.

In general, it is thought that the bias voltage output nodes are provided separately when the device withstand voltage restrictions are strict in most cases. In general, capacitors are manufactured in the same process as that of transistors, and therefore, the withstand voltage of the capacitor is about the same as that of the transistor. For example, FIG. 9 illustrates the case where the withstand voltage of the transistor is VDD/2 and the coupling capacitor is provided only between each bias voltage output node and the output node of the buffer in the previous stage whose potential difference from the node is small. In the output circuit of the third embodiment, the bias voltage at the node N5 is VDD/2−Vth and the bias voltage at the node N6 is VDD/2+Vth. The drive signal at the node N3 changes between VDD/2 and VDD and the drive signal at the node N4 changes between 0 and VDD/2. Consequently, the maximum potential difference between N5 and N4 is about VDD/2−Vth, and therefore, it is possible to connect the capacitor C7. Similarly, the maximum potential difference between N3 and N6 is about VDD/2−Vth, and therefore, it is possible to connect the capacitor C6.

The basic operation of the third embodiment is the same as that of the first embodiment, and therefore, explanation is omitted.

In the output circuit of the third embodiment, it is possible to find desirable capacitance values of the capacitors C6 and C7 by the same calculation expression as that of the first embodiment. However, in FIG. 3B, the component in relation to the voltage fluctuations at the bias voltage output node N7 on one side is excluded. For example, for the node N5, only the coupling capacitor C7 with N4 is provided and the coupling capacitor with N3 is not provided. As a transfer function by an equivalent circuit in this case, an expression below is obtained and if it is assumed that $C_{GD}$ and $C_{GS}$ are substantially equal, the expression is approximated as that on the right side of the expression.

$$Vo/Vi=(aC_{GS}+C_{GD}-bC6,7)/(C_{GS}+C_{GD}+C6,7)\approx((a+1)C_{GD}-bC6,7)/(2C_{GD}+C6,7)$$

Consequently, in the case where it is desired to cancel voltage fluctuations, the capacitance value of C6 and C7 will be a value (a+1)/b times $C_{GD}$. In the case where only small cancellation is made, it may be possible to reduce the capacitance value in accordance with the degree to which voltage fluctuations are desired to be suppressed and the capacitance value is appropriately set to a value equal to or less than (a+1)/b times $C_{GD}$.

Figure 10:
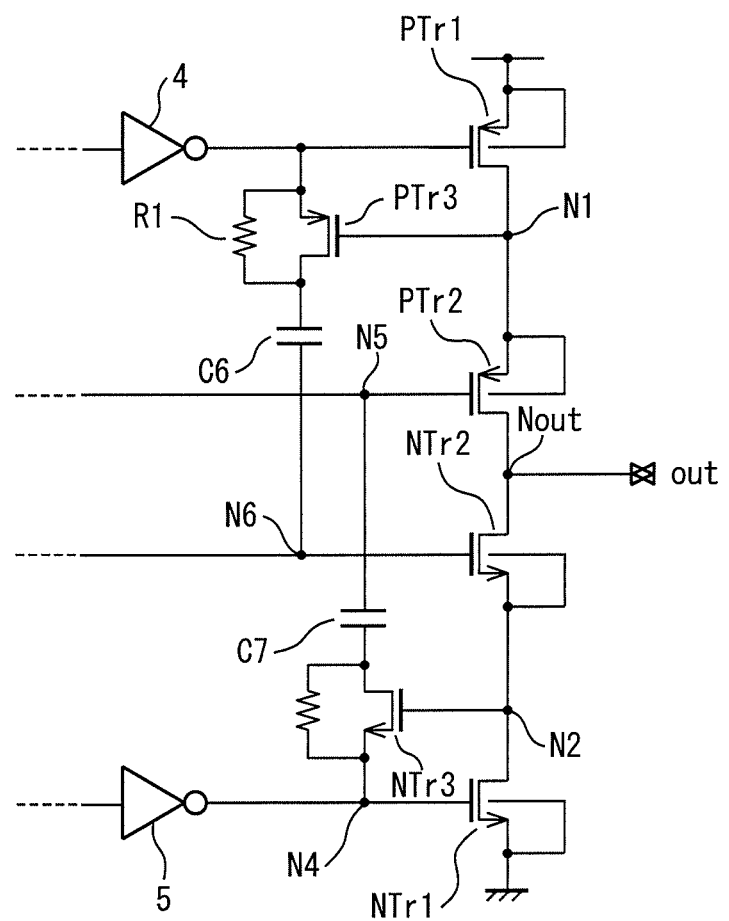
FIG. 10 is a diagram illustrating a configuration of an output circuit of a fourth embodiment.

FIG. 10 is a diagram illustrating a configuration of an output circuit of a fourth embodiment.

The output circuit of the fourth embodiment is an example, in which the configuration of the first and second opposite phase coupling cancellation parts of the second embodiment, i.e. the configuration in which the resistor and the transistor connected in parallel are connected between the coupling capacitor and the node of the drive signal is applied to the output circuit of the third embodiment.

The basic operation of the output circuit of the fourth embodiment is the same as that of the second embodiment, in which the timing at which the opposite phase signal changes steeply is adjusted by connecting or not connecting the resistor by turning on/off the transistor in the set of PTr3 and the resistor R1 and the set of NTr3 and the resistor R2. Due to this, the spike caused at the bias voltage output nodes N5 and N6 is suppressed.

Figure 11A:
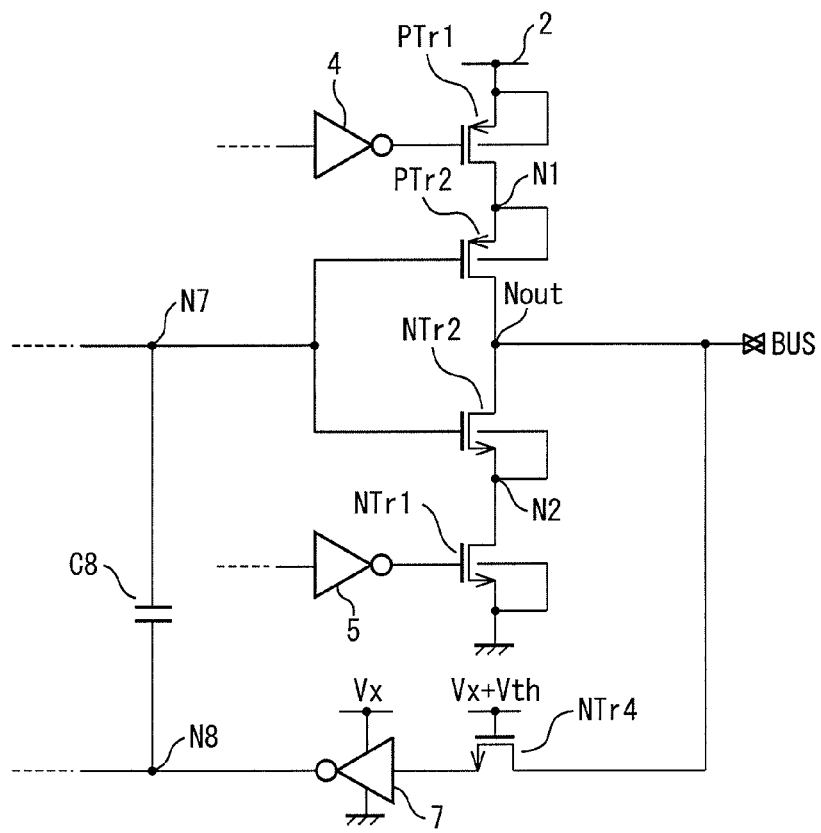
FIG. 11A is a diagram illustrating a configuration of an output circuit of a fifth embodiment.
Figure 11B:
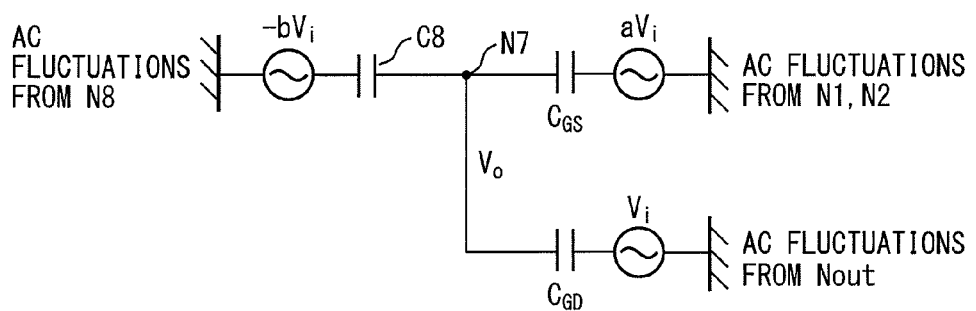
FIG. 11B illustrates an equivalent circuit of the output circuit in FIG. 11A.

FIG. 11A is a diagram illustrating a configuration of an output circuit of a fifth embodiment. FIG. 11B illustrates an equivalent circuit of the output circuit in FIG. 11A.

As illustrated in FIG. 11A, the output circuit of the fifth embodiment is a circuit in which the output node Nout is connected to an input/output bus terminal BUS and an NMOS transistor NTr4, a reentry input initial stage buffer 7, and a capacitor C8 are further provided in the output circuit in FIG. 2. The source of NTr4 is connected to Nout, Vx+Vth is applied to the gate, and the drain is connected to the input of the reentry input initial stage buffer 7. The reentry input initial stage buffer 7 operates using the voltage Vx and GND (0 V) as a power source. The capacitor C8 is connected between an output node N8 of the reentry input initial stage buffer 7 and the node N7.

In the fifth embodiment, the output of the reentry input initial stage buffer 7 is capacitively coupled with N7 as an "opposite phase signal". Except that the "opposite phase signal" utilizes the output of the reentry input initial stage buffer 7, the basic configuration and operation are the same as those of the first embodiment. The reentry input initial stage buffer 7 is manufactured in the same process as that of other transistors, and therefore, the gate withstand voltage is low. Because of this, NTr4 is provided as a step-down element. In the fifth embodiment, a case is supposed where the reentry input initial stage buffer 7 is operated on a power source of 0 to Vx (for example, Vx=VDD/2). Because of this, by giving a potential of Vx+Vth to the gate of the step-down element NTr4, the signal that enters the reentry input initial stage buffer 7 is limited so as to have a voltage between 0 and Vx.

As in the first to fourth embodiments, by utilizing an opposite phase signal by capacitively coupling it in a state where there is almost no phase shift, it is possible to implement the voltage fluctuation suppression effect at the bias voltage output node with a small capacitance value.

Further, while it is possible to embody the first to fourth embodiments only in the case where the output signal of the buffer in the previous stage of the output circuit is utilized, the configuration of the fifth embodiment has a high general-purpose property, i.e., it is also possible to apply the configuration also to an input/output circuit to which the input signal is applied.

It is possible to determine the capacitance value of the capacitor C8 suitable to cancel voltage fluctuations at the bias voltage output node in the fifth embodiment by the same calculation expression as that explained in the first and second embodiments.

The equivalent circuit of the output circuit in FIG. 11A will be one as in FIG. 11B. From this equivalent circuit, for the "voltage fluctuations" that transfer from the input/output terminal, etc., to the bias voltage output node N7 in the fifth embodiment, a transfer function as below is obtained and if it is assumed that $C_{GD}$ and $C_{GS}$ are equal, the expression is approximated as that on the right side of the expression.

$$Vo/Vi=(aC_{GS}+C_{GD}-bC8)/(C_{GS}+C_{GD}+C8) \approx ((a+1)C_{GD}-bC8)/(2C_{GD}+C8)$$

Consequently, in the case where it is desired to cancel voltage fluctuations, the capacitance value of C8 will be a value (a+1)/b times $C_{GD}$ (if a=b=0.5, three times). In the case where only small cancellation is made, it may be possible to reduce the capacitance value in accordance with the degree to which voltage fluctuations are desired to be suppressed and the capacitance value is appropriately set to a value equal to or less than (a+1)/b times $C_{GD}$.

Figure 12:
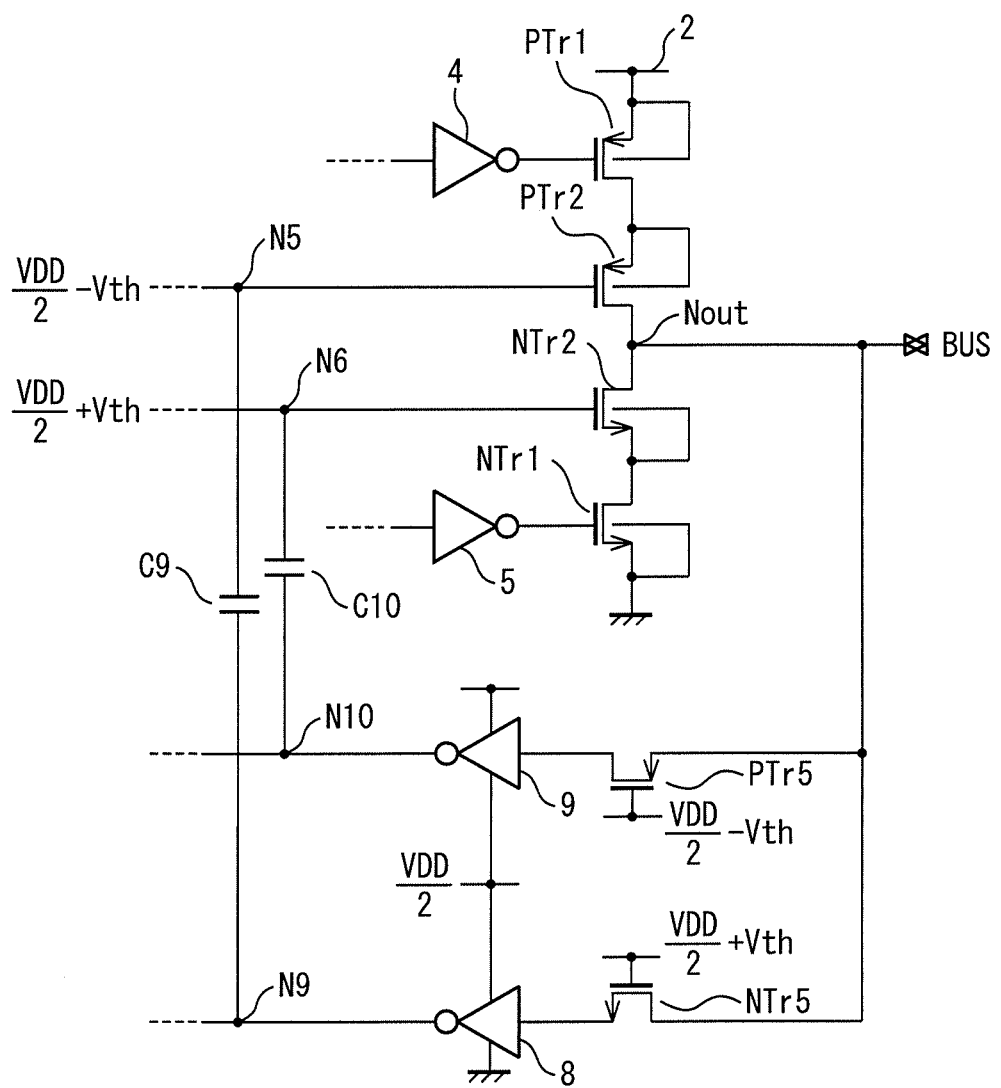
FIG. 12 is a diagram illustrating a configuration of an output circuit of a sixth embodiment.

FIG. 12 is a diagram illustrating a configuration of an output circuit of a sixth embodiment.

The output circuit of the sixth embodiment is an output circuit having the two bias voltage output nodes N5 and N6 to which a configuration in which the output of the reentry input initial stage buffer of the fifth embodiment is capacitively coupled with N7 as an "opposite phase signal" is applied.

As illustrated in FIG. 12, in the output circuit of the sixth embodiment, the output node Nout is connected to the input/output bus terminal BUS in the output circuit in FIG. 1. Further, the output circuit of the sixth embodiment is a circuit in which a PMOS transistor PTr5, an NMOS transistor NTr5, reentry input initial stage buffers 8 and 9, and capacitors C9 and C10 are further provided. The source of PTr5 is connected to Nout, VDD/2−Vth is applied to the gate, and the drain is connected to the input of the reentry input initial stage buffer 9. The source of NTr5 is connected to Nout, VDD/2+Vth is applied to the gate, and the drain is connected to the input of the reentry input initial stage buffer 8. The reentry input initial stage buffer 9 operates using the voltages VDD and VDD/2 as a power source. The reentry input initial stage buffer 8 operates using the voltages VDD and GND (0 V) as a power source. The capacitor C9 is connected between an output node N9 of the reentry input initial stage buffer 8 and the node N5. The capacitor C10 is connected between an output node N10 of the reentry input initial stage buffer 9 and the node N6.

In the sixth embodiment, as in the third and fourth embodiments, in the case where the coupling capacitors C9 and C10 are arranged, the element withstand voltage restrictions (in FIG. 12, VDD/2) need to be met, and therefore, the reentry input initial stage buffers 8 and 9 are prepared at each bias voltage output node. In the sixth embodiment, the potential at the bias voltage output node N5 is VDD/2−Vth and the reentry input initial stage buffer 8 that changes the potential at the output node N9 between 0 and VDD/2 is prepared, and thus, N9 and N5 are connected by the capacitor C9. Further, the potential at the bias voltage output node N6 is VDD/2+Vth and the reentry input initial stage buffer 9 that changes the potential at the output node N10 between VDD/2 and VDD is prepared, and thus, N10 and N6 are connected by the capacitor C10. Due to this, the maximum potential difference applied to the capacitors C9 and C10 is suppressed to about VDD/2−Vth and settings are done so as to avoid violation of the element withstand voltage. Further, the step-down elements NTr5 and PTr5 are prepared and control is performed so that the signal to the gate of each reentry input initial stage buffer becomes a signal whose voltage is in the same range as that of the operation power source. Specifically, this is implemented by giving VDD/2+Vth to the gate of NTr5 for the signal path that operates on 0 to VDD/2 and by giving VDD/2−Vth to the gate of PTr5 for the signal path that operates on VDD/2 to VDD.

The operation of the sixth embodiment is the same as that of the fifth embodiment, and therefore, explanation is omitted.

In the sixth embodiment, the capacitance value of the capacitors C9 and C10 suitable to cancel voltage fluctuations is obtained by the same calculation expression as that of the fifth embodiment, and therefore, the capacitance value of C9 and C10 will be a value (a+1)/b times $C_{GD}$ (if a=b=0.5, three times). In the case where only small cancellation is made, it may be possible to reduce the capacitance value in accordance with the degree to which voltage fluctuations are desired to be suppressed and the capacitance value is appropriately set to a value equal to or less than (a+1)/b times $C_{GD}$.

As explained above, according to the embodiments, it is possible to suppress voltage fluctuations at the bias voltage output node with a smaller capacitance value than that in the case where a bypass capacitor is arranged between the bias voltage output node and the power source (high potential power source, GND) etc.

Further, according to the embodiments, it is possible to suppress voltage fluctuations only by adding a capacitor and a circuit is not newly added.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An output circuit comprising:
a first PMOS transistor and a second PMOS transistor connected in series between a high potential side power source and an output node, the first PMOS transistor being connected to the high potential side power source and the second PMOS transistor being connected to the output node;
a first NMOS transistor and a second NMOS transistor connected in series between a low potential side power source and the output node, the first NMOS transistor being connected to the low potential side power source and the second NMOS transistor being connected to the output node;
a first capacitive coupling part including a first terminal and a second terminal, the first terminal being connected to a gate terminal of the first PMOS transistor, the second terminal being connected to a gate terminal of the second PMOS transistor or a gate terminal of the second NMOS transistor, and the first capacitive coupling part being configured to control capacitive coupling between the first and second terminals based on a potential at the gate terminal of the first PMOS transistor; and
a second capacitive coupling part including a third terminal and a fourth terminal, the third terminal being connected to a gate terminal of the first NMOS transistor, the fourth terminal being connected to the gate terminal of the second NMOS transistor or the gate terminal of the second PMOS transistor, and the second capacitive coupling part being configured to control capacitive coupling between the third and fourth terminals based on a potential at the gate terminal of the first NMOS transistor, wherein a first bias voltage is applied to the gate terminal of the second PMOS transistor;

a second bias voltage is applied to the gate terminal of the second NMOS transistor;

a first drive signal is supplied to the gate terminal of the first PMOS transistor;

a second drive signal is supplied to the gate terminal of the first NMOS transistor;

the first capacitive coupling part comprises:

a first resistor, one end of which is connected to the first terminal of the first capacitive coupling part, a third PMOS transistor, a source terminal of which is connected to the first terminal and a gate terminal of which is connected to a drain terminal of the first PMOS transistor, and a first capacitor, one end of which is connected to the other end of the first resistor and to a drain terminal of the third PMOS transistor and the other end of which is connected to the second terminal of the first capacitive coupling part; and the second capacitive coupling part comprises:

a second resistor, one end of which is connected to the third terminal of the second capacitive coupling part, a third NMOS transistor, a source terminal of which is connected to the third terminal of the second capacitive coupling part and a gate terminal of which is connected to a drain terminal of the first NMOS transistor, and a second capacitor, one end of which is connected to the other end of the second resistor and to a drain terminal of the third NMOS transistor and the other end of which is connected to the fourth terminal of the second capacitive coupling part.

2. The output circuit according to claim 1, wherein the gate terminal of the second PMOS transistor and the gate terminal of the second NMOS transistor are connected, and the first bias voltage and the second bias voltage are common.

3. The output circuit according to claim 1, wherein the first capacitive coupling part is connected between the gate terminal of the first PMOS transistor and the gate terminal of the second PMOS transistor, and the second capacitive coupling part is connected between the gate terminal of the first NMOS transistor and the gate terminal of the second NMOS transistor.

* * * * *